US010446613B2

(12) United States Patent
Lee et al.

(10) Patent No.: US 10,446,613 B2
(45) Date of Patent: Oct. 15, 2019

(54) METHOD OF MANUFACTURING AN ORGANIC LIGHT EMITTING DIODE DISPLAY HAVING AN AUXILIARY MEMBER IN CONTACT WITH AN UPPER SURFACE OF AN AUXILIARY ELECTRODE

(71) Applicant: SAMSUNG DISPLAY CO., LTD., Yongin-si, Gyeonggi-Do (KR)

(72) Inventors: Se Ho Lee, Cheonan-si (KR); Tae Hyung Kim, Seoul (KR); Je-Hyun Song, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/186,817

(22) Filed: Nov. 12, 2018

(65) Prior Publication Data

US 2019/0081111 A1 Mar. 14, 2019

Related U.S. Application Data

(62) Division of application No. 15/711,103, filed on Sep. 21, 2017, now Pat. No. 10,147,769.

(30) Foreign Application Priority Data

Dec. 7, 2016 (KR) .......................... 10-2016-0165997

(51) Int. Cl.
*H01L 51/50* (2006.01)
*H01L 27/32* (2006.01)
(Continued)

(52) U.S. Cl.
CPC ........ *H01L 27/3206* (2013.01); *H01L 27/127* (2013.01); *H01L 27/3276* (2013.01);
(Continued)

(58) Field of Classification Search
CPC ....... H01L 25/048; H01L 51/50; H01L 33/00; H01L 33/08
See application file for complete search history.

(56) References Cited

U.S. PATENT DOCUMENTS

| 2007/0048886 A1 | 3/2007 | Winters et al. |
| 2007/0080356 A1 | 4/2007 | Nakayama et al. |
(Continued)

FOREIGN PATENT DOCUMENTS

| EP | 1489671 A2 | 12/2004 |
| KR | 10-0546663 | 1/2006 |
(Continued)

OTHER PUBLICATIONS

Extended European Search Report dated May 4, 2018 for European Patent Application No. 17205586.5.

*Primary Examiner* — Hoai V Pham
(74) *Attorney, Agent, or Firm* — F. Chau & Associates, LLC (57) ABSTRACT

An organic light emitting diode display according to an exemplary embodiment includes: a substrate; a pixel formed on the substrate and including a pixel area displaying an image and a peripheral area adjacent to the pixel area; an insulating layer at the pixel area and the peripheral area on the substrate; a first electrode at the pixel area on the insulating layer; an organic emission layer on the first electrode and extending to the peripheral area; a second electrode on the organic emission layer and disposed in the pixel area and the peripheral area; an auxiliary electrode in the peripheral area on the substrate and partially exposed by a first opening formed in the insulating layer; and an auxiliary member disposed on the auxiliary electrode and in contact with an upper surface of the auxiliary electrode exposed by the first opening.

8 Claims, 12 Drawing Sheets

(51) Int. Cl.
*H01L 51/00* (2006.01)
*H01L 27/12* (2006.01)
*H01L 51/52* (2006.01)

(52) U.S. Cl.
CPC ...... *H01L 27/3279* (2013.01); *H01L 51/0002* (2013.01); *H01L 51/0023* (2013.01); *H01L 51/5228* (2013.01); *H01L 2227/32* (2013.01)

(56) References Cited

U.S. PATENT DOCUMENTS

| | | |
|---|---|---|
| 2014/0239262 A1 | 8/2014 | Kim et al. |
| 2014/0374732 A1* | 12/2014 | Jeong .................. H01L 27/3246 257/40 |
| 2016/0293888 A1 | 10/2016 | Shim et al. |
| 2017/0200776 A1 | 7/2017 | Park et al. |
| 2018/0158878 A1 | 6/2018 | Lee et al. |

FOREIGN PATENT DOCUMENTS

| | | |
|---|---|---|
| KR | 10-2010-0028925 | 3/2010 |
| KR | 10-2014-0106049 | 9/2014 |
| KR | 10-2014-0141529 | 12/2014 |
| KR | 10-2016-0023745 | 3/2016 |

\* cited by examiner

METHOD OF MANUFACTURING AN ORGANIC LIGHT EMITTING DIODE DISPLAY HAVING AN AUXILIARY MEMBER IN CONTACT WITH AN UPPER SURFACE OF AN AUXILIARY ELECTRODE

CROSS-REFERENCE TO RELATED APPLICATION

This application is a Division of U.S. patent application Ser. No. 15/711,103, filed on Sep. 21, 2017, which claims priority to and the benefit of Korean Patent Application No. 10-2016-0165997, filed in the Korean Intellectual Property Office on Dec. 7, 2016, the entire contents of which are incorporated by reference herein in their entirety.

TECHNICAL FIELD

The present disclosure relates to a display device, and more particularly, to an organic light emitting diode (OLED) display device and a method of manufacturing the OLED display device.

DISCUSSION OF THE RELATED ART

Currently popular display devices include liquid crystal displays (LCDs), plasma display panels (PDPs), organic light emitting diode (OLED) displays, field effect displays (FEDs), and electrophoretic displays (EPDs).

Particularly, the organic light emitting diode (OLED) display includes two electrodes and an organic emission layer disposed therebetween. Electrons from one electrode and holes from the other electrode combine within the organic emission layer to thereby form excitons, which release energy in the form of light as they relax.

The organic light emitting diode (OLED) display accordingly has a self-luminous characteristic, and because the organic light emitting diode (OLED) display does not need a separate light source, unlike a liquid crystal display (LCD), the OLED display can be relatively thin and light weight. Further, the organic light emitting diode (OLED) display exhibits high-quality characteristics such as low power consumption, high luminance, and fast response speed, and thus receives attention as a next generation display device.

As the organic light emitting diode display is larger, a screen smudge defect may be observed as a result of a voltage drop in the common electrode. To solve the voltage drop problem, the common electrode and a common voltage line are connected to each other in each sub-pixel.

To connect the common electrode and the common voltage line to each other, the common electrode and the common voltage line are electrically connected to each other by removing a part of an organic emission layer with a laser.

However, in the process of removing the part of the organic emission layer by using the laser, a metal layer disposed under the organic emission layer may be damaged, and a remaining gas component of the organic layer may be discharged into the damaged metal layer such that the common electrode may be oxidized.

SUMMARY

The present invention provides an organic light emitting diode display and a manufacturing method for preventing the metal layer positioned under the organic emission layer from being damaged by the laser.

Also, the present invention provides an organic light emitting diode display and a manufacturing method for preventing the common electrode from being oxidized due to the discharge of the remaining gas of the organic layer due to the damaged metal layer.

An organic light emitting diode display according to an exemplary embodiment includes: a substrate; a pixel formed on the substrate and including a pixel area displaying an image and a peripheral area adjacent to the pixel area; an insulating layer formed at the pixel area and the peripheral area on the substrate; a first electrode formed at the pixel area on the insulating layer; an organic emission layer formed on the first electrode and extending to the peripheral area; a second electrode formed on the organic emission layer and disposed in the pixel area and the peripheral area; an auxiliary electrode disposed in the peripheral area on the substrate and partially exposed by a first opening formed in the insulating layer; and an auxiliary member disposed on the auxiliary electrode and in contact with an upper surface of the auxiliary electrode exposed by the first opening.

The organic emission layer may be disposed on the auxiliary member in the peripheral area, and may have a second opening exposing part of the auxiliary member.

The second electrode may be in contact with the auxiliary member through the second opening.

The second opening may have a circular shape.

The auxiliary member may cover the first opening of the insulating layer.

The auxiliary member may be in contact with a part of an interior circumference of the first opening.

The auxiliary member may be formed with the same layer as the first electrode.

The auxiliary member may be formed by sequentially stacking ITO (indium tin oxide), silver (Ag), and ITO.

The auxiliary electrode may be a common voltage line transmitting a common voltage.

The auxiliary electrode may be formed by sequentially stacking molybdenum (Mo), aluminum (Al), and molybdenum (Mo).

The pixel may include at least one sub-pixel including the pixel area and the peripheral area, and the sub-pixel may be a red sub-pixel.

A manufacturing method of an organic light emitting diode display according to an exemplary embodiment includes: preparing a substrate; forming a thin film transistor including a semiconductor layer, a gate electrode on the semiconductor layer, and a source electrode and a drain electrode connected to the semiconductor layer on the substrate; forming an auxiliary electrode supplying a common voltage on the substrate; forming an insulating layer on the thin film transistor and the auxiliary electrode and exposing parts of the drain electrode and the auxiliary electrode; forming a first electrode on the insulating layer and in contact with the drain electrode; forming an auxiliary member in contact with the auxiliary electrode through a first opening formed in the insulating layer; forming an organic emission layer on the first electrode and the auxiliary member; removing a part of the organic emission layer to expose a part of the auxiliary member; and forming a second electrode on the organic emission layer.

The removal of the part of the organic emission layer may be performed by using a laser.

The removal of the part of the organic emission layer may include forming a second opening by removing the part of the organic emission layer.

The second opening may have a circular shape.

The method may further include forming a pixel definition layer having a third opening exposing the part of the auxiliary member and a fourth opening exposing the part of the first electrode.

The source electrode, the drain electrode, and the auxiliary electrode may be formed with the same layer.

The first electrode and the auxiliary member may be formed with the same layer.

The auxiliary member may be in contact with an entire upper surface of the auxiliary electrode exposed by the first opening.

According to the organic light emitting diode display and the manufacturing method thereof, damage to the metal layer positioned under the organic emission layer by the laser removing the part of the organic emission layer may be prevented.

Also, oxidization of the common electrode by the remaining gas component of the organic layer may be prevented.

Further, generation of a dark spot in the organic light emitting diode display due to no emission of the organic emission layer may be prevented.

In addition, a voltage drop being generated in the organic light emitting diode display such that the luminance becomes non-uniform may be prevented.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE DRAWINGS

Exemplary embodiments of the present invention will be described more fully hereinafter with reference to the accompanying drawings. As those skilled in the art would realize, the described embodiments may be modified in various different ways, all without departing from the spirit or scope of the present disclosure. The drawings and description are to be regarded as illustrative in nature. Like reference numerals may designate like elements throughout the specification.

In the drawings, the thicknesses of layers, films, panels, regions, areas, etc., may be exaggerated for clarity. It will be understood that when an element such as a layer, film, region, or substrate is referred to as being "on" another element, it can be directly on the other element or intervening elements may also be present.

Also, the present invention is not limited to the number of thin film transistors (TFT) and capacitors shown in accompanying drawings, and in the organic light emitting diode display, each pixel may be provided with a plurality of transistors and at least one capacitor, and may be formed to have various structures by further forming additional wires or omitting existing wires. As defined herein, the pixel is a minimum unit for displaying an image, and the organic light emitting diode display displays the image through the plurality of pixels. In particular, the pixel may be a minimum unit for displaying any desired color, while the sub-pixel may be a minimum unit for displaying a particular single color.

An organic light emitting diode display according to an exemplary embodiment of the present invention will be described below with reference to FIG. 1 to FIG. 3.

The organic light emitting diode display according to an exemplary embodiment of the present invention may be made of a plurality of pixels each including a plurality of sub-pixels. Each sub-pixel can display a primary color such as red, green, blue, etc., and a predetermined color may be realized in one pixel by a combination of a plurality of sub-pixels representing these colors.

Figure 2:
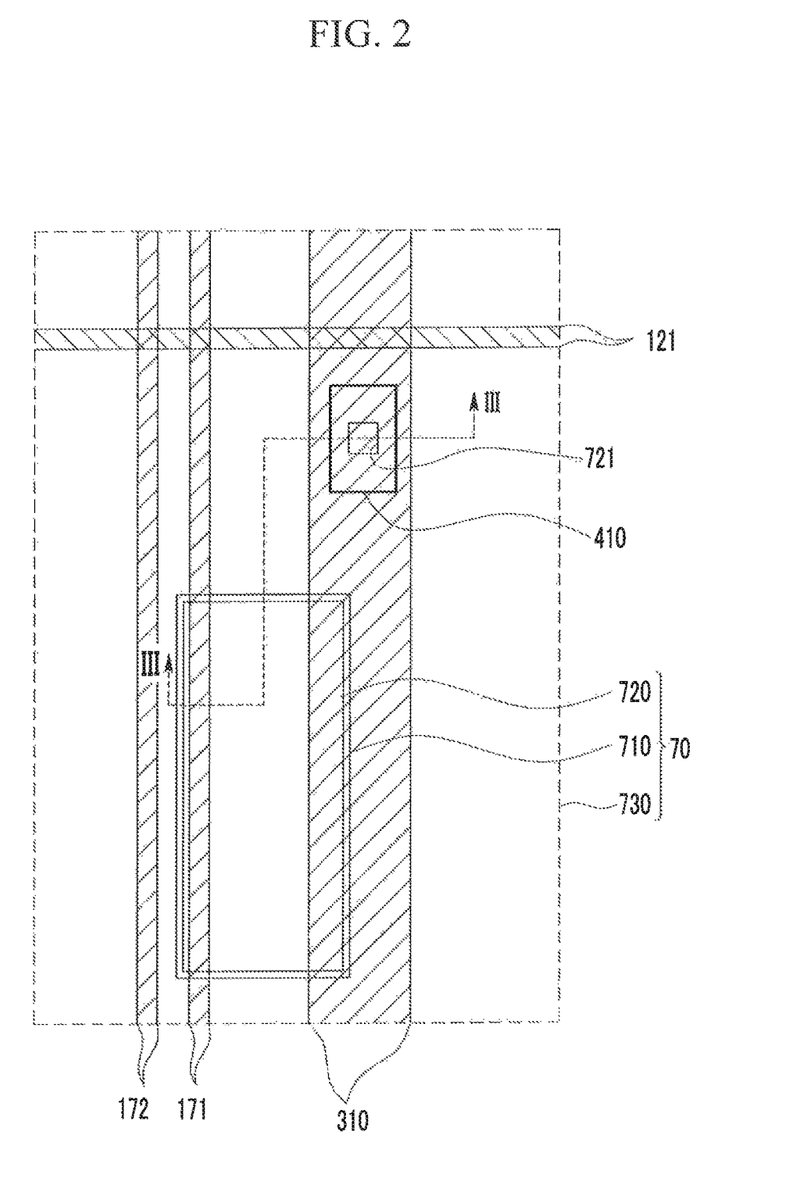
FIG. 2 is a partial layout view illustrating an organic light emitting diode display according to an exemplary embodiment of the present invention.
Figure 3:
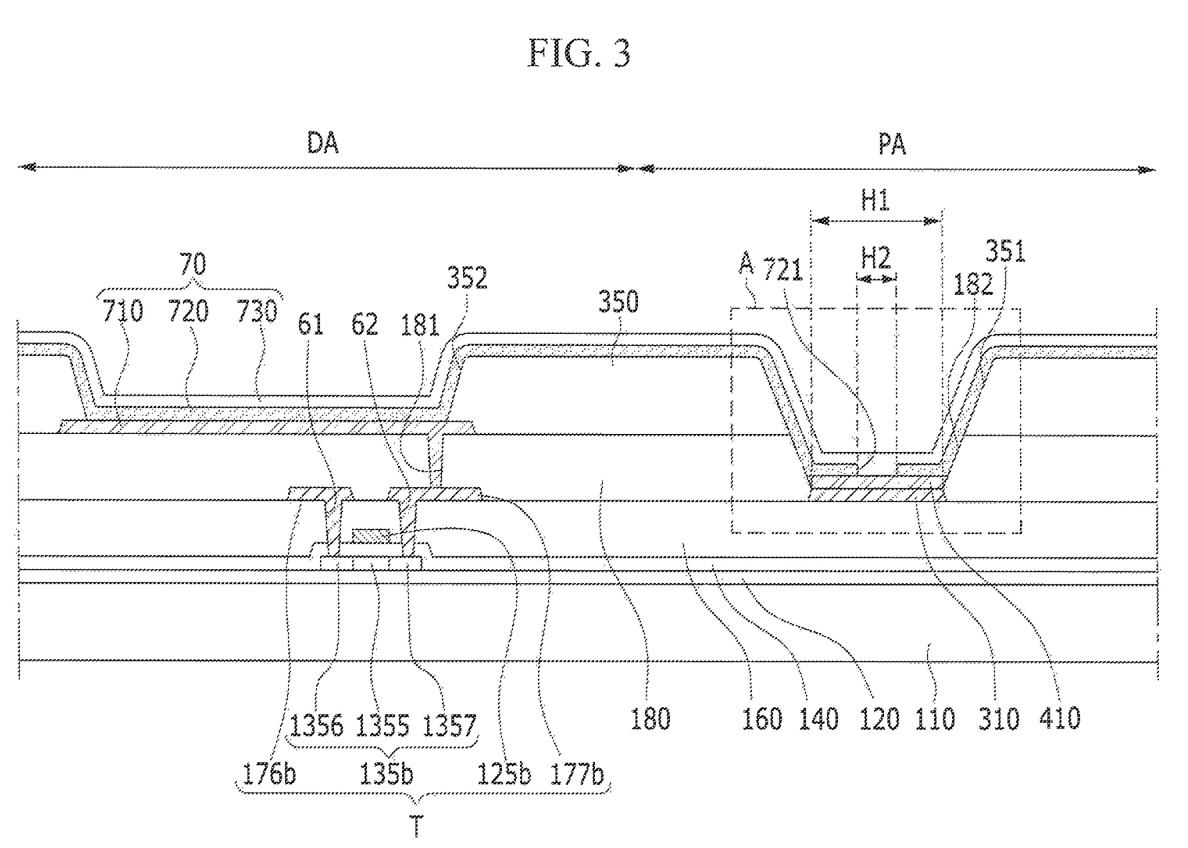
FIG. 3 is a cross-sectional view taken along a line III-III of FIG. 2.

Referring to FIG. 2 and FIG. 3, at least one sub-pixel may include a display area DA emitting light and a peripheral area PA adjacent to the display area DA. According to an exemplary embodiment of the present invention, light is emitted from an organic emission layer 720 disposed between a first electrode 710 and a second electrode 730 in the display area DA, and a common voltage may be transmitted to the second electrode 730 through an auxiliary electrode 310 disposed in the peripheral area PA.

According to an exemplary embodiment of the present invention, at least one sub-pixel among a plurality of sub-pixels of one pixel may include the peripheral area PA. For example, when the plurality of sub-pixels are respectively a red sub-pixel, a green sub-pixel, and a blue sub-pixel, only the red sub-pixel may include both the display area DA and the peripheral area PA, while the green sub-pixel and the blue sub-pixel may each only include the display area DA. The common voltage supplied through the red sub-pixel may be commonly used in the green sub-pixel and the blue sub-pixel.

However, the present invention is not limited to this particular arrangement, and the red sub-pixel, the green sub-pixel, and the blue sub-pixel may all include the display area DA and the peripheral area PA. The common voltage is respectively supplied to the red, green, and blue sub-pixels.

A principal of operation of one sub-pixel of the organic light emitting diode display will be described below with reference to FIG. 1.

Figure 1:
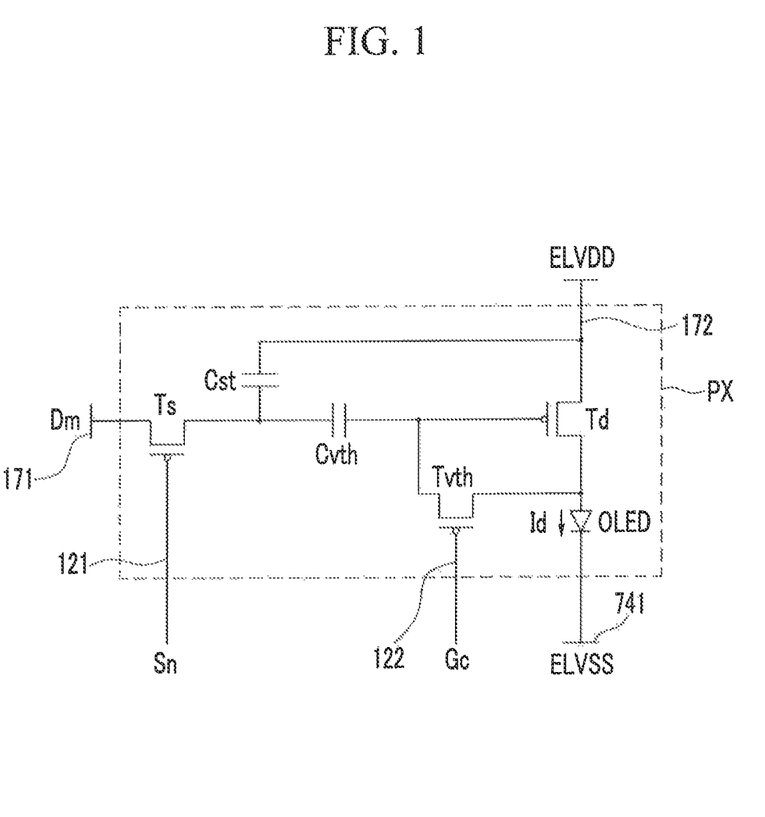
FIG. 1 is an equivalent circuit diagram illustrating one pixel of an organic light emitting diode display according to an exemplary embodiment of the present invention.

FIG. 1 is an equivalent circuit diagram illustrating one pixel of an organic light emitting diode display according to an exemplary embodiment of the present invention.

As shown in FIG. 1, in the organic light emitting diode display according to an exemplary embodiment of the present invention, one sub-pixel PX includes a plurality of signal lines 121, 122, 171, and 172; a plurality of transistors Td, Ts, and Tvth connected to the plurality of signal lines; a plurality of capacitors Cst and Cvth; and an organic light emitting diode OLED.

The plurality of transistors Td, Ts, and Tvth include a driving transistor Td, a switching transistor Ts, and a compensation transistor Tvth. The plurality of capacitors Cst and Cvth includes a storage capacitor Cst and a compensation capacitor Cvth.

The signal lines 121, 122, 171, 172 includes a gate line 121 transmitting a scan signal Sn, a compensation control line 122 transmitting a compensation control signal Gc to the compensation transistor Tvth, a data line 171 crossing the gate line 121 and transmitting a data voltage Dm, and a driving voltage line 172 transmitting a driving voltage ELVDD to the driving transistor Td.

A gate electrode of the driving transistor Td is connected to one terminal of the compensation capacitor Cvth, a source electrode of the driving transistor Td is connected to the driving voltage line 172, and a drain electrode of the driving transistor Td is electrically connected to an anode of the organic light emitting diode OLED.

The compensation transistor Tvth includes a gate electrode connected to the compensation control line 122, a source electrode connected to the drain electrode of the driving transistor Td and the anode of the organic light emitting diode OLED, and a drain electrode connected to one terminal of the compensation capacitor Cvth and the gate electrode of the driving transistor Td. The compensation transistor Tvth is turned on according to the compensation control signal Gc transmitted through the compensation control line 122 such that the gate electrode and the drain electrode of the driving transistor Td are connected to each other, thereby diode-connecting the driving transistor Td.

A voltage corresponding to a threshold voltage of the driving thin film transistor Td is programmed in the compensation capacitor Cvth when the driving transistor Td is diode-connected.

The gate electrode of the switching thin film transistor Ts is connected to the gate line 121, the source electrode of the switching thin film transistor Ts is connected to the data line 171, and the drain electrode of the switching thin film transistor Ts is connected to the other terminal of the storage capacitor Cst and the other terminal of the compensation capacitor Cvth. The switching thin film transistor Ts is turned on according to the scan signal Sn transmitted through the gate line 121.

One terminal of the storage capacitor Cst is connected to the driving voltage line 172, and a gate-source voltage of the driving transistor Td is determined according to the programmed voltage in the compensation capacitor Cvth and the storage capacitor Cst. The cathode of the organic light emitting diode OLED is connected to a common voltage line 741 transmitting a common voltage ELVSS.

The organic light emitting diode OLED emits light according to a driving current Id transmitted through the driving transistor Td from the driving voltage line 172, and the driving current Id flows into the common voltage line 741.

The present invention is not limited to the 3-transistor and 2-capacitor structure is described herein, and the number of transistors and capacitors may vary.

A detailed structure of an organic light emitting diode display according to an exemplary embodiment of the present invention will be described below with reference to FIG. 2 and FIG. 3.

Referring to FIG. 2 and FIG. 3, a substrate 110 may be formed as an insulating substrate including glass, quartz, ceramic, or a plastic. The substrate 110 may be made of a flexible material.

Also, a buffer layer 120 is formed on the substrate 110. The buffer layer 120 may be formed over an entire surface of the substrate 110 throughout the display area DA and the peripheral area PA. The buffer layer 120 may be formed as a single layer of a silicon nitride (SiNx), or as a dual-layer structure in which a silicon nitride (SiNx) and a silicon oxide (SiOx) are stacked. The buffer layer 120 may prevent permeation of undesirable components such as impurities or moisture, and may also planarize the surface of the substrate 110.

A switching semiconductor layer and a driving semiconductor layer 135b may be formed on the buffer layer 120 and may be separated from each other. Hereafter, the driving semiconductor layer will be described.

The driving semiconductor layer 135b may be made of a polysilicon or an oxide semiconductor. The oxide semiconductor may include an oxide based on titanium (Ti), hafnium (Hf), zirconium (Zr), aluminum (Al), tantalum (Ta), germanium (Ge), zinc (Zn), gallium (Ga), tin (Sn), (In) such as zinc oxide (ZnO), indium-gallium-zinc oxide (InGaZnO4), indium zinc oxide (Zn—In—O), zinc-tin oxide (Zn—Sn—O), indium gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium gallium oxide (In—Ge—Ga—O), titanium-indium-zinc oxide (Ti—In—Zn—O), and/or hafnium-indium-zinc oxide (Hf—In—Zn—O) which are complex oxides thereof.

When the driving semiconductor layer 135b is made of the oxide semiconductor, to protect the oxide semiconductor that is vulnerable to an external environment such as a high temperature, a separate passivation layer may be added.

The driving semiconductor layer 135b includes a channel area in which impurities are not doped, and a source area and a drain area in which impurities are doped at respective sides of the channel area. The impurities used may be selected according to a kind of thin film transistor being used, and may be, for example, N-type impurities or P-type impurities.

The driving semiconductor layer 135b is divided into a channel region 1355, a source region 1356, and a drain region 1357. The source region 1356 and the drain region 1357 are respectively formed at opposite sides of the channel region 1355.

The channel region 1355 of the driving semiconductor layer 135b may include polycrystalline silicon in which no impurity is doped (an intrinsic semiconductor).

The source region 1356 and the drain region 1357 of the driving semiconductor layer 135b may include polycrystalline silicon in which a conductive impurity is doped (an impurity semiconductor).

A gate insulating layer 140 is formed on the driving semiconductor layer 135b. The gate insulating layer 140 may be a single layer or a multilayer including at least one of a silicon nitride and a silicon oxide.

A driving gate electrode 125b is formed on the gate insulating layer 140.

The driving gate electrode 125b may be disposed on the driving semiconductor layer 135b. The driving gate electrode 125b may at least partially overlap the channel region 1355.

An interlayer insulating layer 160 is formed on the driving gate electrode 125b. The interlayer insulating layer 160 may be made of a silicon nitride or a silicon oxide.

The interlayer insulating layer 160 and the gate insulating layer 140 have a source contact hole 61 and a drain contact hole 62 respectively exposing the source region 1356 and the drain region 1357. A driving source electrode 176b and a driving drain electrode 177b are formed on the interlayer insulating layer 160.

The driving source electrode 176b is connected to the source region 1356 through the source contact hole 61. The driving drain electrode 177b faces the driving source electrode 176b.

The driving drain electrode 177b is connected to the drain region 1357 through the drain contact hole 62.

The driving semiconductor layer 135b, the driving gate electrode 125b, the driving source electrode 176b, and the driving drain electrode 177b form a driving thin film transistor T.

The driving thin film transistor T corresponds to a switching element. According to an exemplary embodiment of the present invention, the driving thin film transistor 1T may be formed in each sub-pixel of the organic light emitting diode display.

A planarization layer 180 is formed on the driving source electrode 176b and the driving drain electrode 177b. The planarization layer 180 serves to planarize a step and to thereby increase emission efficiency of the organic light emitting element that will be formed thereon.

The planarization layer 180 may be made of a polyacrylate resin, an epoxy resin, a phenolic resin, a polyamide resin, a polyimide resin, an unsaturated polyester resin, a polyphenylene ether resin, a polyphenylene sulfide resin, and/or benzocyclobutene (BCB).

As described above, the sub-pixel PX includes the display area DA and the peripheral area PA, and the display area DA may include the first electrode 710, the organic emission layer 720, and the second electrode 730 so as to emit light.

A first electrode, e.g. a pixel electrode 710, is formed on the planarization layer 180. The pixel electrode 710 may be formed of a transparent conductive material such as indium tin oxide (ITO), indium zinc oxide (IZO), zinc oxide (ZnO), or indium oxide (In2O3), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au). For example, the pixel electrode 710 may be formed by sequentially stacking ITO, Ag, and ITO.

The pixel electrode 710 is electrically connected to the driving drain electrode 177b of the thin film transistor T through a contact hole 181 formed in the interlayer insulating layer 160, thereby constituting the anode of the organic light emitting element 70.

A pixel definition layer 350 is formed on the planarization layer 180 and an edge of the pixel electrode 710. The pixel definition layer 350 has a fourth opening 352 exposing the pixel electrode 710. The pixel definition layer 350 may also have a third opening 351 exposing a part of an auxiliary member 410, which is described in greater detail below.

The pixel definition layer 350 may be made of a resin such as a polyacrylate resin and a polyimide resin, a silica-based inorganic material, or the like.

An organic emission layer 720 is formed in the fourth opening 352 of the pixel definition layer 350. The organic emission layer 720 is formed on the first electrode 710 exposed in the display area DA and also extends to the peripheral area PA. As shown in FIG. 3, the organic emission layer 720 is also disposed in the third opening 351 of the pixel definition layer 350.

The organic emission layer 720 has a multilayer structure including an emission layer and a hole-injection layer (HIL), a hole-transporting layer (HTL), electron-transporting layer (ETL), and/or an electron-injection layer (EIL).

When the organic emission layer 720 includes all of the above-mentioned layers, the hole injection layer may be disposed on the pixel electrode 710 to correspond to an anode, and the hole transporting layer, the emission layer, the electron transporting layer, and the electron injection layer may be sequentially stacked thereon.

The organic emission layer 720 may include a red emitting layer emitting red light, a green emitting layer emitting green light, and a blue emitting layer emitting blue light. The red emitting layer, the green emitting layer, and the blue emitting layer are respectively formed on a red pixel, a green pixel, and a blue pixel to implement a color image.

A second electrode (common electrode) 730, is formed on the pixel definition layer 350 and the organic emission layer 720. The common electrode 730 is formed as a single structure across the plurality of sub-pixels. For example, the common electrode 730 may be formed continuously throughout the red sub-pixel, the green sub-pixel, and the blue sub-pixel.

In addition, according to an exemplary embodiment of the present invention, the common electrode 730 extends to the peripheral area PA as well as the display area DA. Accordingly, the common electrode 730 may be disposed on the organic emission layer 720 within the peripheral area PA.

The common electrode 730 may include a transparent conductive material such as indium tin oxide (ITO), indium zinc oxide (IZO), zinc oxide (ZnO), or indium oxide (In2O3), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au).

The common electrode 730 acts as the cathode of the organic light emitting element 70. As described above, the pixel electrode 710, the organic emission layer 720, and the common electrode 730 form the organic light emitting element 70.

In the peripheral area PA of the sub-pixel PX, the auxiliary electrode 310 may be disposed on the interlayer insulating layer 160. The auxiliary electrode 310 transmits a common voltage ELVSS to the common electrode 730. The auxiliary electrode 310 may correspond to a common voltage line transmitting the common voltage ELVSS.

The auxiliary electrode 310 may be exposed by a first opening 182 formed in the planarization layer 180. A part of an upper surface of the auxiliary electrode 310 may be exposed by the first opening 182.

A cross-sectional shape of the first opening 182 may be rectangular.

Accordingly, the auxiliary electrode 310 may also be exposed with the rectangular shape.

The auxiliary electrode 310 may be formed of the same layer as the above-described driving source electrode 176b and driving drain electrode 177b. For example, the auxiliary electrode 310, the driving source electrode 176b, and the driving drain electrode 177b may be formed by forming and patterning the same metal layer on the interlayer insulating layer 160.

The auxiliary electrode 310 may have a multilayer structure in which metal layers includes copper (Cu), copper alloys, aluminum (Al), aluminum alloys, molybdenum (Mo), and molybdenum alloys are stacked. For example, the auxiliary electrode 310 may have a triple-layer structure including titanium/aluminum/titanium (Ti/Al/Ti), molybdenum/aluminum/molybdenum (Mo/Al/Mo), or molybdenum/copper/molybdenum (Mo/Cu/Mo).

According to an exemplary embodiment of the present invention, an auxiliary member 410 that is in contact with the auxiliary electrode 310 is disposed on the auxiliary electrode 310. The auxiliary member 410 is in contact with the auxiliary electrode 310, thereby transmitting the common voltage ELVSS through the auxiliary electrode 310 to the common electrode 730.

The auxiliary member 410 is in contact with the entire upper surface of the auxiliary electrode 310 exposed in the first opening 182. For example, to not expose the planarization layer 180 between the auxiliary electrode 310 and the auxiliary member 410, the auxiliary member 410 covers the entire upper surface of the auxiliary electrode 310.

According to an exemplary embodiment of the present invention, the auxiliary member 410 is only disposed within the first opening 182 of the planarization layer 180. The auxiliary member 410 is in contact with a part of an interior circumference of the first opening 182. For example, part of the auxiliary member 410 is not disposed at the upper surface of the planarization layer 180.

Figure 4:
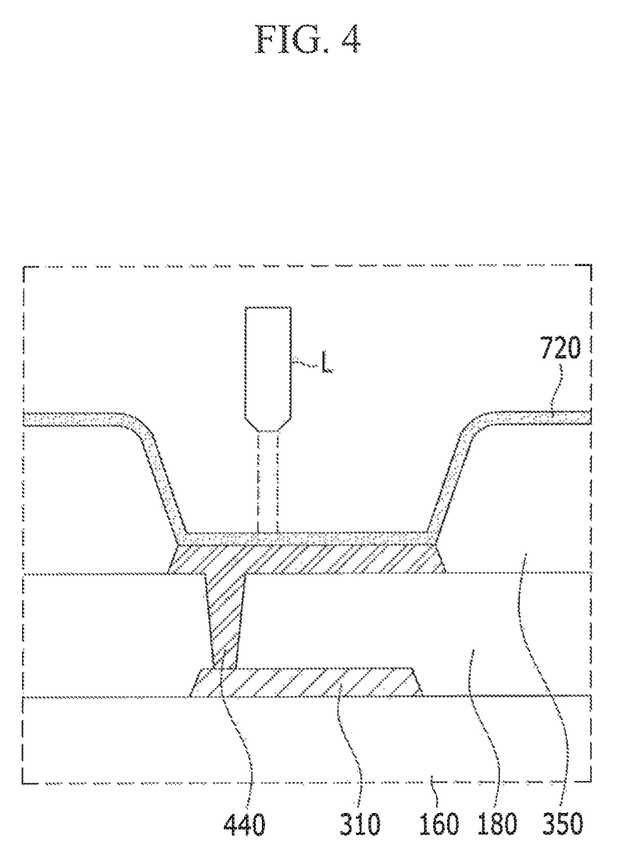
FIG. 4 and FIG. 5 are views illustrating a comparative example explaining a process in which an auxiliary member of a region A of FIG. 3 is damaged.
Figure 5:
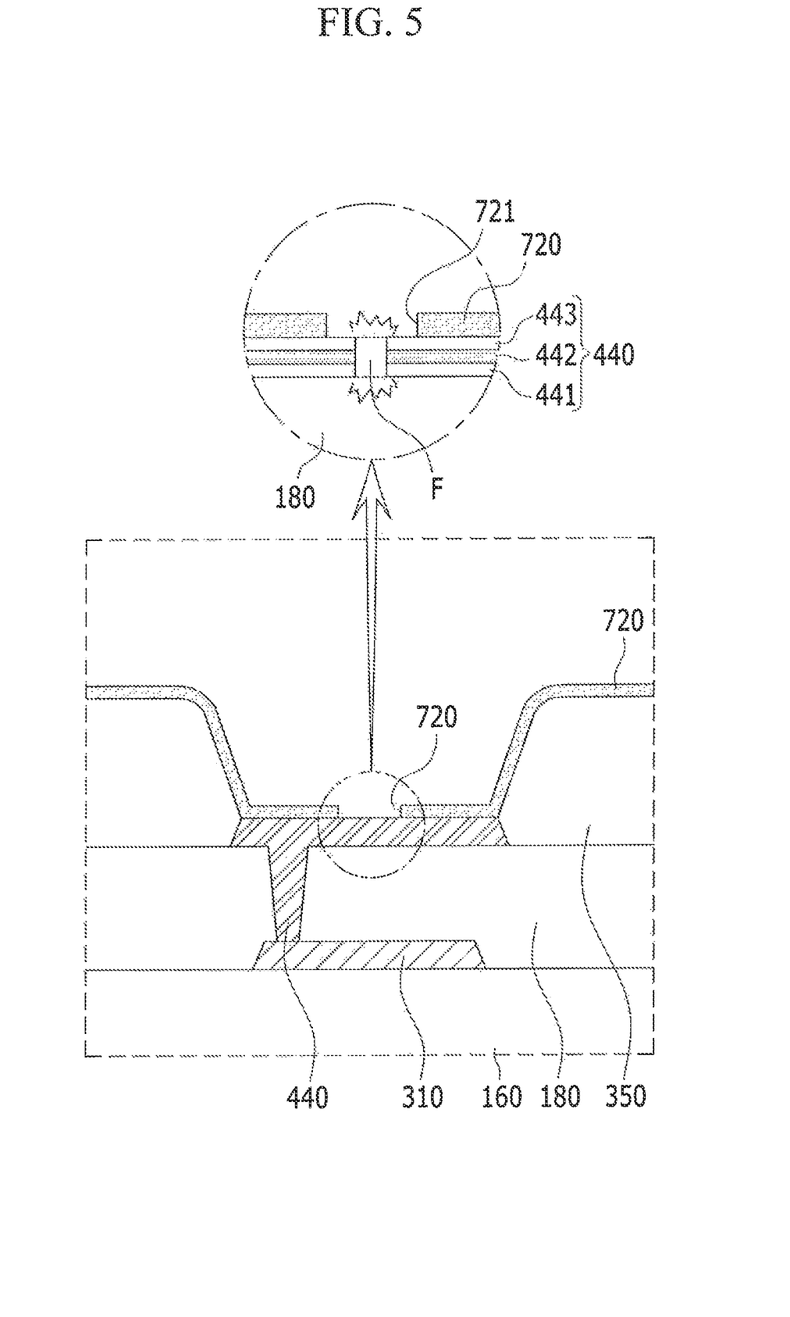

Referring to FIG. 4 and FIG. 5, if the planarization layer 180 is formed between an auxiliary member 440 and the auxiliary electrode 310, in the process of forming a second opening 721 in the organic emission layer 720 by using a laser L, the auxiliary member 440 may be damaged.

For example, when the auxiliary member 440 is made of an first ITO layer 441, a Ag layer 442, and a second ITO layer 443, while the auxiliary member 440 is bent to the side of the planarization layer 180 by the laser L, the first ITO layer 441, the Ag layer 442, and the second ITO layer 443 may each be cut (F). Accordingly, while the remaining gas component in the planarization layer of the organic layer is discharged through the cut region (F), the common electrode 730 may be oxidized. If the common electrode 730 is oxidized, the organic emission layer 720 might not emit light.

Referring to FIG. 3, according to an exemplary embodiment of the present invention, as the auxiliary member 410 is disposed to be in contact with the exposed entire upper surface of the auxiliary electrode 310, the auxiliary member 410 may be prevented from being bent in the lower direction and damaged by the laser L. Accordingly, the oxidization of the common electrode 730 is prevented and generation of a dark spot of the organic light emitting diode display due to lack of emission of the organic emission layer 720 may be prevented.

The auxiliary electrode 310 of the metal material disposed under the auxiliary member 410 serves to support the auxiliary member 410.

As the auxiliary member 410 is in contact with the entire upper surface of the auxiliary electrode 310, a contact area of the auxiliary member 410 and the auxiliary electrode 310 increases such that resistance of the wire to which the common voltage is transmitted may be reduced. Accordingly, in the organic light emitting diode display, the voltage drop (JR-Drop) may be prevented and accordingly, the luminance may remain uniform.

The auxiliary member 410 may be formed of the same layer as the first electrode 710. The auxiliary member 410 may be made of a transparent conductive material such as indium tin oxide (ITO), indium zinc oxide (IZO), zinc oxide (ZnO), or indium oxide (In2O3), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au). For example, the auxiliary member 410 may be formed by sequentially stacking ITO, Ag, and ITO.

Figure 6:
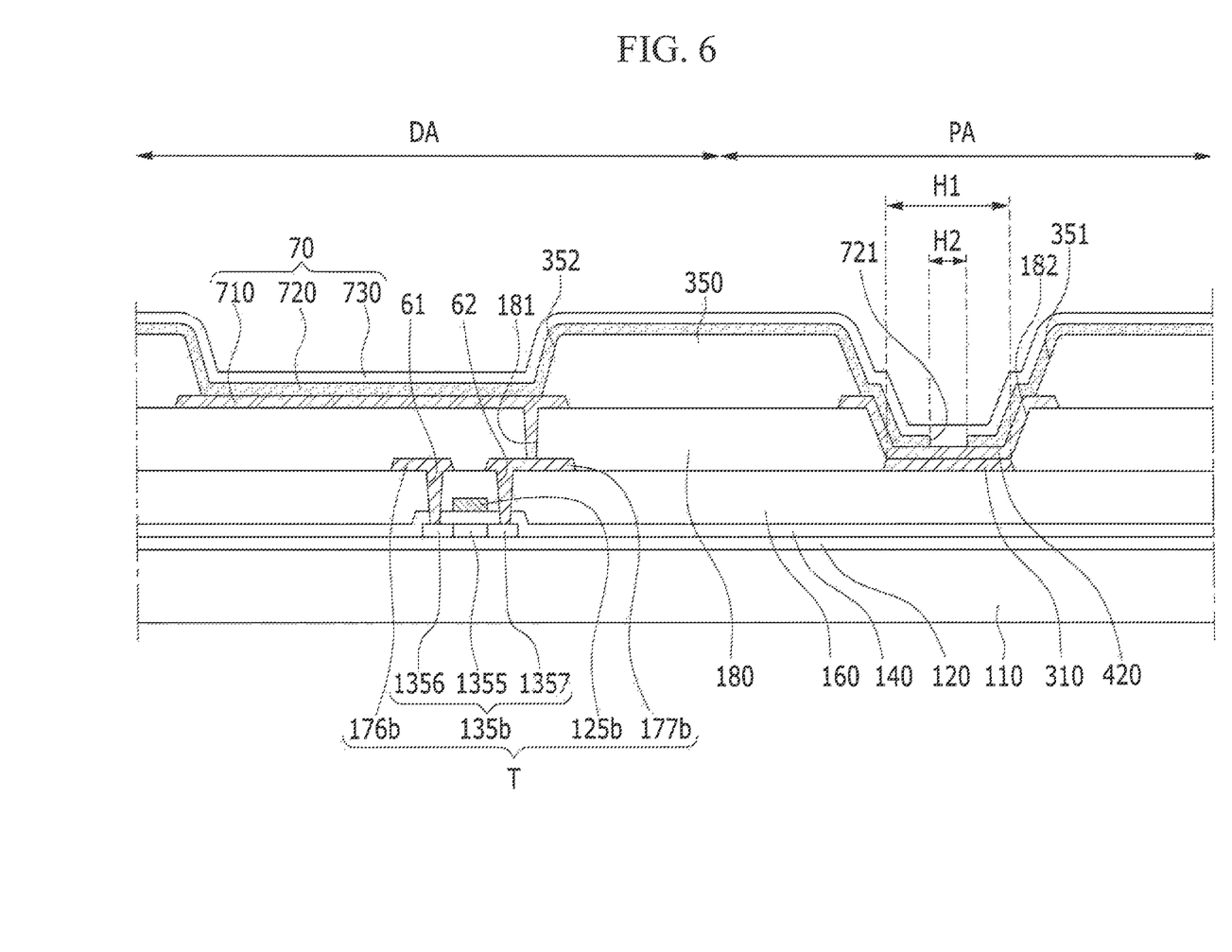
FIG. 6 is a view illustrating an exemplary variation of an organic light emitting diode display of FIG. 3.

In FIG. 4, the auxiliary member 410 is disposed within the first opening 182, however part of an auxiliary member 440 may be disposed at the upper surface of the planarization layer 180. As shown in FIG. 6, the auxiliary member 420 fills the first opening 182 of the planarization layer 180, and a part thereof may be disposed at the upper surface of the planarization layer 180.

According to an exemplary embodiment of the present invention, the organic emission layer 720 is disposed on the auxiliary member 410 in the peripheral area PA. In the organic emission layer 720, a second opening 721 exposing part of the underlying auxiliary member 410 is formed. The second opening 721 of the organic emission layer 720 is formed by the laser L. After the organic emission layer 720 is coated on the auxiliary member 410, the organic emission layer 720 is irradiated by the laser L in the region where the auxiliary member 410 and the auxiliary electrode 310 are overlapped with each other.

By the laser L, the second opening 721 is formed in the organic emission layer 720. The cross-sectional shape of the second opening 721 may be circular.

A diameter H2 of the second opening 721 may be smaller than a width H1 of the first opening 182. However, the present invention is not limited to this particular structure, and the diameter H2 of the second opening 721 may be formed to be equal to the width H1 of the first opening 182. If the diameter H2 of the second opening 721 increases, the contact area of the auxiliary member 410 and the overlying second electrode 730 may increase. As described above, if the contact area increases, the resistance of the wire transmitting the common voltage may be reduced.

In the peripheral area PA, a second electrode 730 may be formed on the organic emission layer 720. The second electrode 730 may be in contact with the auxiliary member 410 through the second opening 721. Accordingly, the second electrode 730 may be electrically connected to the auxiliary member 410 and the auxiliary electrode 310. Therefore, the common voltage ELVSS supplied through the auxiliary electrode 310 may be supplied to the second electrode 730 through the auxiliary member 410.

Hereinafter, a method of manufacturing the organic light emitting diode display according to an exemplary embodiment of the present invention will be described. When describing the manufacturing method of the organic display device according to an exemplary embodiment of the present invention, it may be understood that like elements may be similar to or identical to corresponding elements that were already described, and accordingly, repeated description of these elements may be omitted.

Figure 7:
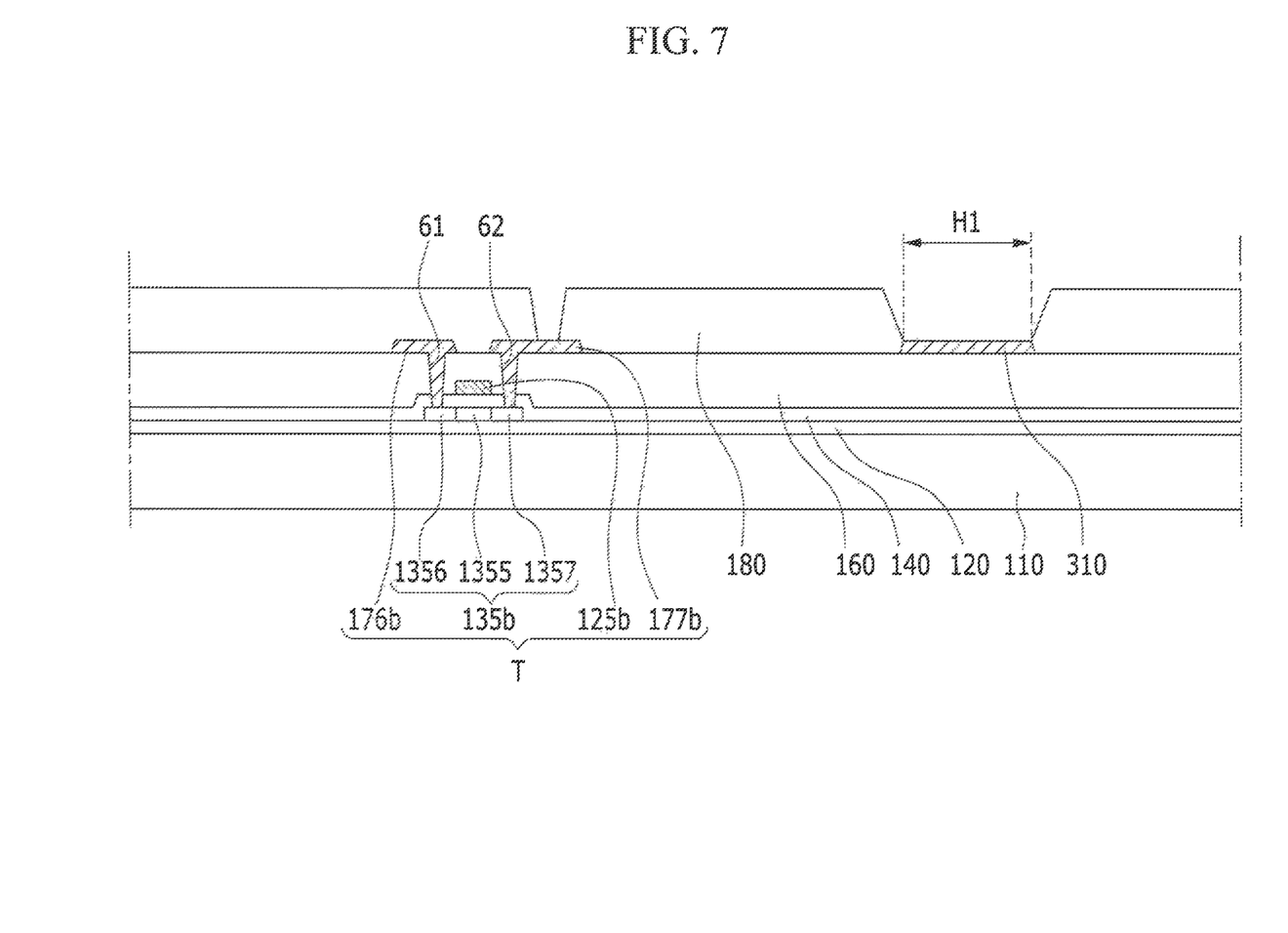
FIG. 7 to FIG. 12 are views sequentially illustrating a method of manufacturing an organic light emitting diode display according to an exemplary embodiment of the present invention.

First, as shown in FIG. 7, a thin film transistor T is formed on a substrate 110. The thin film transistor T may be the switching thin film transistor or the driving thin film transistor.

The thin film transistor T includes a semiconductor layer 135b, a gate electrode 125b, a source electrode 176b, and a drain electrode 177b. The gate electrode 125b is spaced apart from the semiconductor layer 135b. The source electrode 176b and the drain electrode 177b are disposed above the gate electrode 125b.

An auxiliary electrode 310 is simultaneously formed with the source electrode 176b and the drain electrode 177b. After coating the metal layer on the interlayer insulating layer 160, a photolithography process is performed on the metal layer to form the auxiliary electrode 310, and to divide the source electrode 176*b* and the drain electrode 177*b*.

Next, a planarization layer 180 is formed on the source electrode 176*b* and drain electrode 177*b*, and the auxiliary electrode 310.

Figure 8:
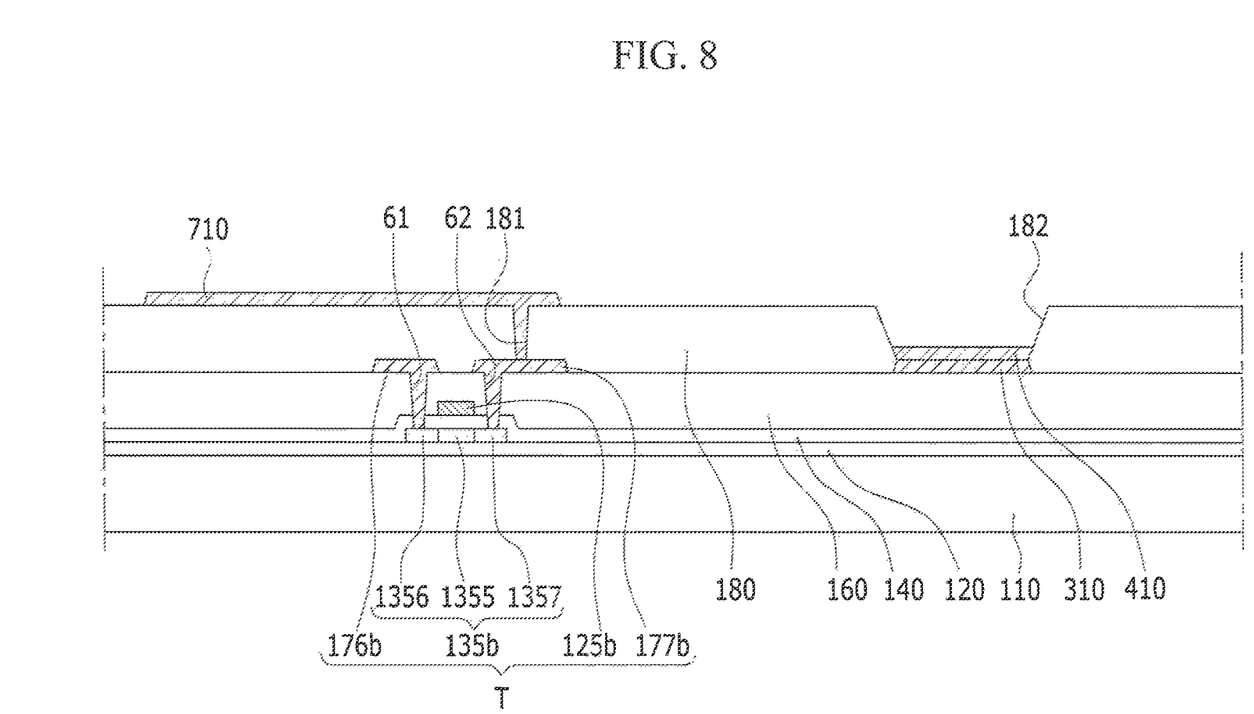

Also, referring to FIG. 8, by the patterning process, a contact hole 181 exposing part of the auxiliary electrode 310 and a first opening 182 exposing part of the drain electrode 177*b* are formed in the planarization layer 180.

The cross-sectional shape of the first opening 182 may be rectangular.

Accordingly, the exposed auxiliary electrode 310 may be exposed with the rectangular shape.

Next, a first electrode 710 and an auxiliary member 410 are formed on the planarization layer 180, thereby the first electrode 710 is in contact with the drain electrode 177*b* and the auxiliary member 410 is in contact with the auxiliary electrode 310. The auxiliary member 410 is in contact with the entire upper surface of the auxiliary electrode 310 exposed by the first opening 182.

The first electrode 710 and the auxiliary member 410 are formed with the same layer. For example, after the same metal layer is formed on the planarization layer 180, the photolithography process is performed on the metal layer to form the first electrode 710 and to divide the auxiliary member 410.

Figure 9:
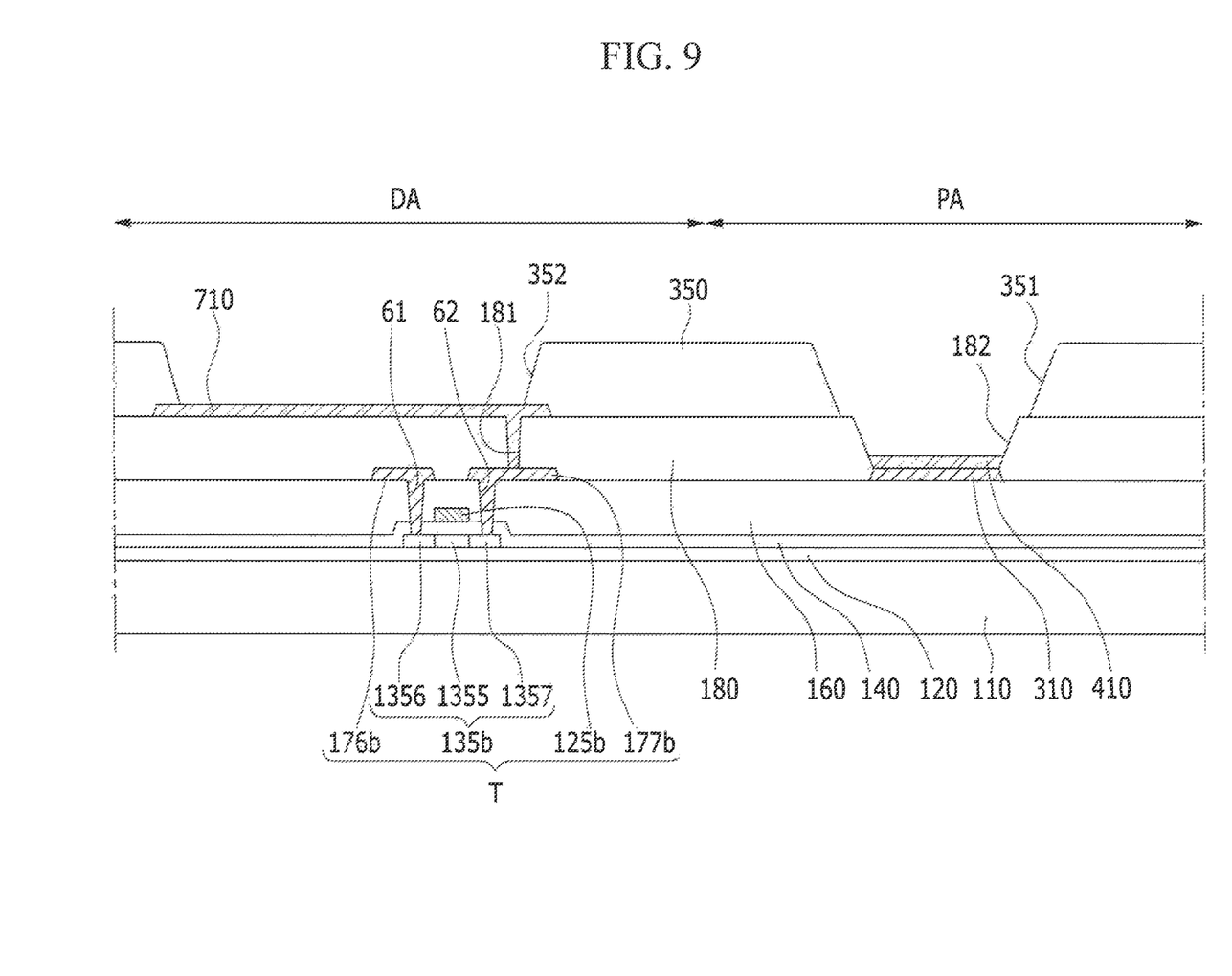

Next, as shown in FIG. 9, a pixel definition layer 350 is formed on the planarization layer 180. In the pixel definition layer 350, a third opening 351 exposing part of the auxiliary member 410 and a fourth opening 352 exposing part of the first electrode 710 are formed.

Figure 10:
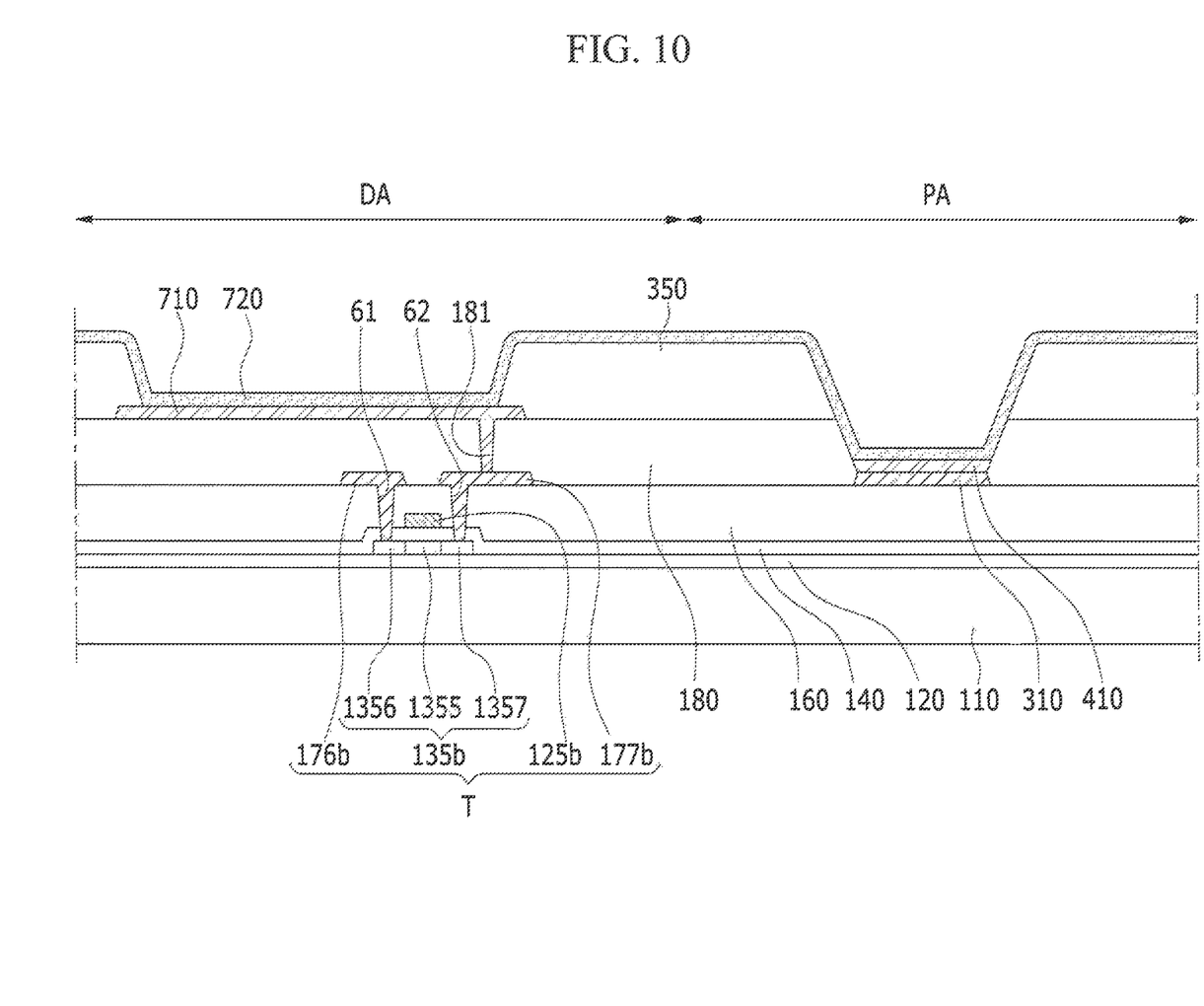

Next, an organic emission layer 720 is coated on the pixel definition layer 350. Referring to FIG. 10, the organic emission layer 720 is formed in the display area DA and the peripheral area PA. The organic emission layer 720 is disposed inside the third opening 351 and the fourth opening 352 of the pixel definition layer 350 to cover the auxiliary member 410 and the first electrode 710, respectively.

According to an exemplary embodiment of the present invention, after coating the organic emission layer 720, part of the organic emission layer 720 is removed to expose part of the auxiliary member 410 in the peripheral area PA. If part of the organic emission layer 720 is removed, a second opening 721 is formed in the organic emission layer 720.

Figure 11:
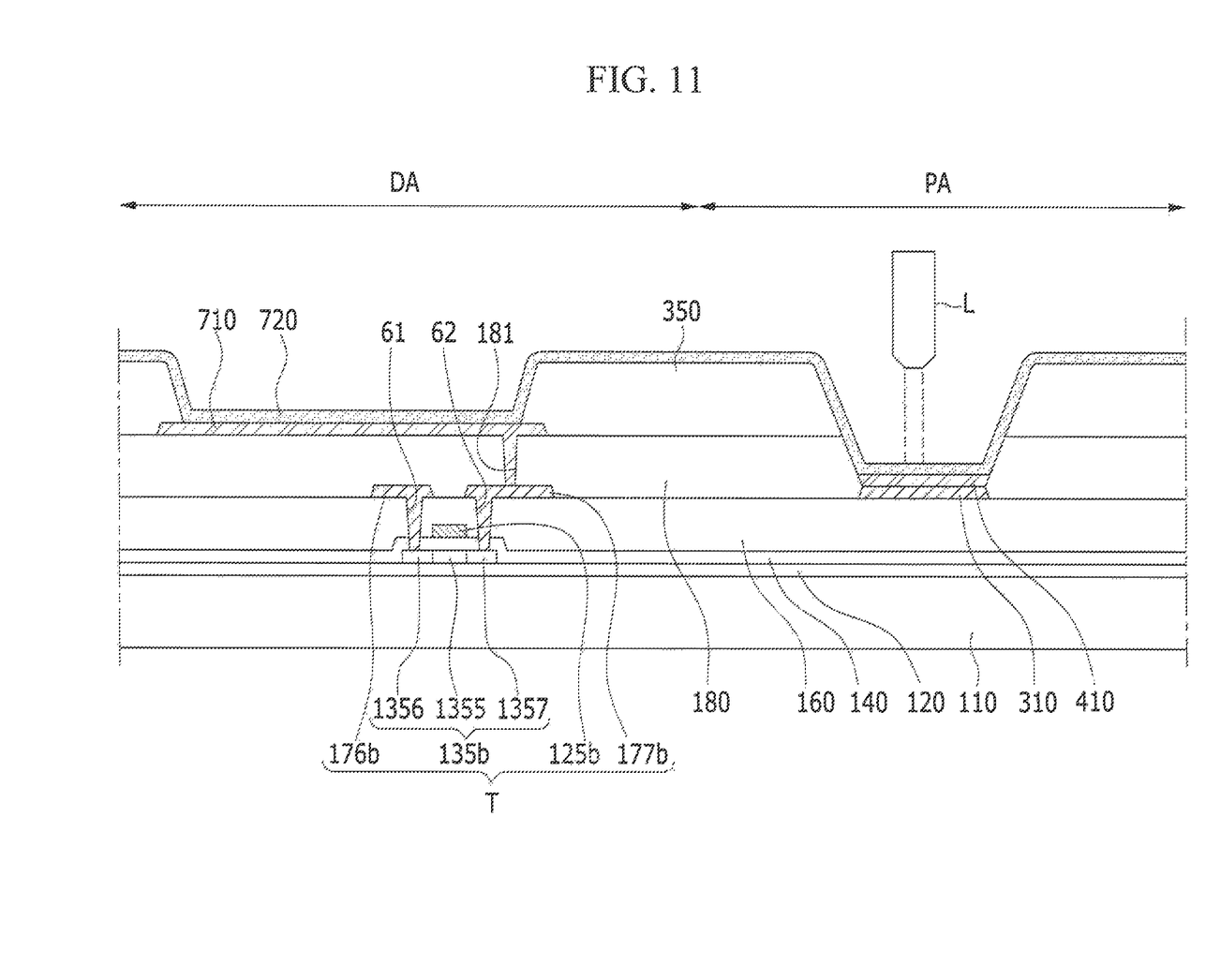

Referring to FIG. 11, part of the organic emission layer 720 is removed by using the laser L to form the second opening 721. After the laser L is positioned at a center part of the region where the auxiliary member 410 and the auxiliary electrode 310 are overlapped, the organic emission layer 720 is irradiated by the laser L. The second opening 721 formed in the organic emission layer 720 may be made with a circular shape by the laser L.

As described above, as the auxiliary electrode 310 is disposed to be in contact under the auxiliary member 410, the auxiliary member 410 might not be bent down and damaged by the laser L.

Figure 12:
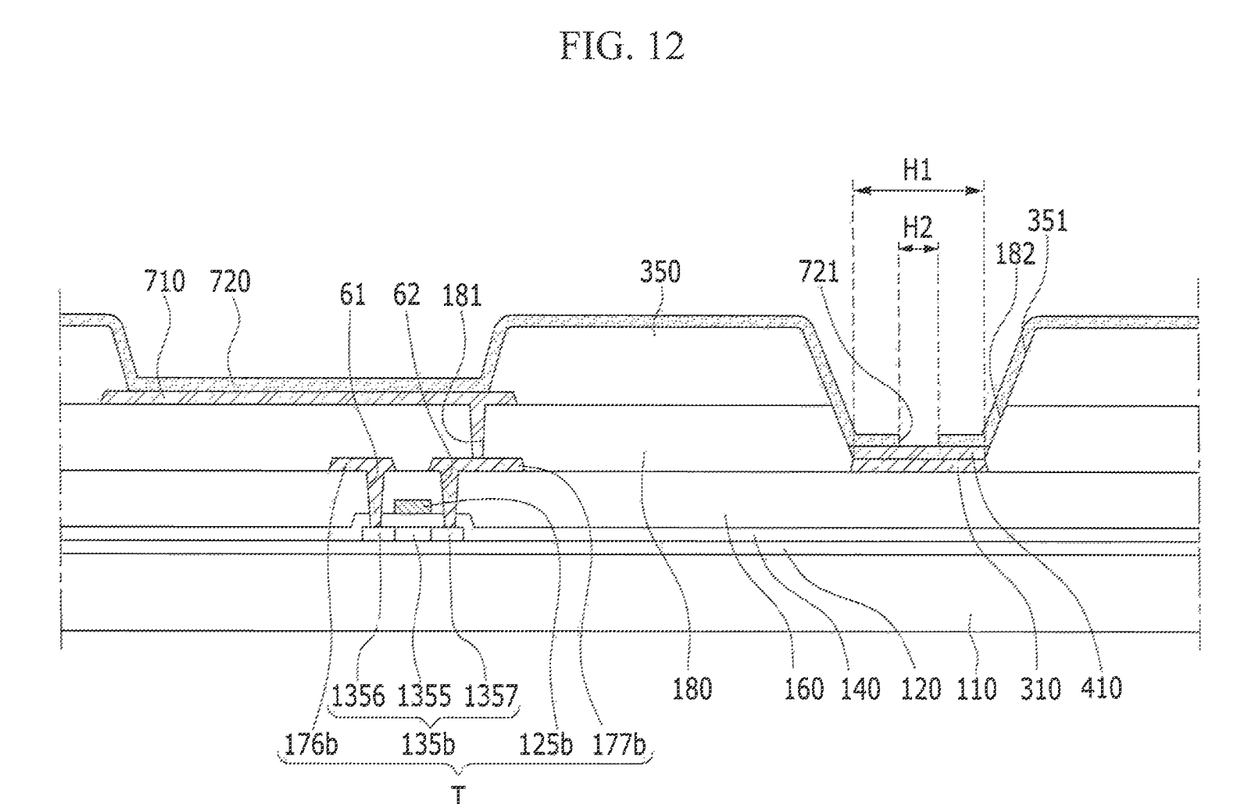

Next, the second electrode 730 is formed on the organic emission layer 720. The second electrode 730 may be in contact with the auxiliary member 410 through the second opening 721. Accordingly, the second electrode 730 may be electrically connected to the auxiliary member 410 and the auxiliary electrode 310. Therefore, the common voltage ELVSS supplied through the auxiliary electrode 310 may be supplied to the second electrode 730 through the auxiliary member 410.

In the organic light emitting diode display and the method of manufacturing the OLED display, according to an exemplary embodiment of the present invention, in the process of removing part of the organic emission layer 720 by using the laser L, the auxiliary member 410 may be prevented from being damaged by the laser L. Additionally, the common electrode 730 may be prevented from being oxidized as remaining gas component of the organic layer is prevented from being discharged along a gap of a damaged auxiliary member 410.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the present disclosure.

What is claimed is:

1. A method for manufacturing an organic light emitting diode display, comprising:
   preparing a substrate;
   forming a thin film transistor including a semiconductor layer, a gate electrode on the semiconductor layer, and a source electrode and a drain electrode connected to the semiconductor layer on the substrate;
   forming an auxiliary electrode supplying a common voltage on the substrate;
   forming an insulating layer on the thin film transistor and the auxiliary electrode and exposing parts of the drain electrode and the auxiliary electrode;
   forming a first electrode on the insulating layer and in contact with the drain electrode;
   forming an auxiliary member in contact with the auxiliary electrode through a first opening formed in the insulating layer;
   forming an organic emission layer on the first electrode and the auxiliary member;
   removing a part of the organic emission layer to expose a part of the auxiliary member; and
   forming a second electrode on the organic emission layer.

2. The method of claim 1, wherein
   the removing of the part of the organic emission layer is performed by using a laser.

3. The method of claim 1, wherein
   the removing of the part of the organic emission layer includes forming a second opening by removing the part of the organic emission layer.

4. The method of claim 3, wherein
   the second opening has a circular shape.

5. The method of claim 1, further comprising
   forming a pixel definition layer having a third opening exposing the part of the auxiliary member and a fourth opening exposing the part of the first electrode.

6. The method of claim 1, wherein:
   the source electrode, the drain electrode, and the auxiliary electrode are formed with the same layer.

7. The method of claim 1, wherein
   the first electrode and the auxiliary member are formed with the same layer.

8. The method of claim 1, wherein
   the auxiliary member is in contact with an entire upper surface of the auxiliary electrode exposed by the first opening.

* * * * *